United States Patent
Wang et al.

(10) Patent No.: US 11,075,287 B2
(45) Date of Patent: Jul. 27, 2021

(54) SEMICONDUCTOR STRUCTURE AND FORMING METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Nan Wang, Shanghai (CN); Ruoyuan Li, Shanghai (CN)

(73) Assignees: Semiconductor Manufacturing (Shanghai) International Corporation, Shanghai (CN); Semiconductor Manufacturing (Beijing) International Corporation, Beijing (CN)

(*) Notice: Subject to any disclaimer, the term of this patent is extended or adjusted under 35 U.S.C. 154(b) by 0 days.

(21) Appl. No.: 16/459,978

(22) Filed: Jul. 2, 2019

(65) Prior Publication Data
US 2020/0013873 A1    Jan. 9, 2020

(30) Foreign Application Priority Data
Jul. 5, 2018    (CN) .......................... 201810733462.2

(51) Int. Cl.
| H01L 29/66 | (2006.01) |
| H01L 29/06 | (2006.01) |
| H01L 29/78 | (2006.01) |
| H01L 21/762 | (2006.01) |
| H01L 21/311 | (2006.01) |

(Continued)

(52) U.S. Cl.
CPC ...... *H01L 29/6681* (2013.01); *H01L 21/3085* (2013.01); *H01L 21/3086* (2013.01); *H01L 21/30604* (2013.01); *H01L 21/31111* (2013.01); *H01L 21/31144* (2013.01);
(Continued)

(58) Field of Classification Search
CPC ............ H01L 29/6681; H01L 29/0653; H01L 29/7851; H01L 21/76224; H01L 21/31144; H01L 21/3085; H01L 21/3086; H01L 21/31111; H01L 21/30604; H01L 29/66795; H01L 21/76229; H01L 29/7855; H01L 29/0607
See application file for complete search history.

(56) References Cited

U.S. PATENT DOCUMENTS

2018/0102409 A1* 4/2018 Xie ................... H01L 21/76224

* cited by examiner

*Primary Examiner* — Edward Chin
(74) *Attorney, Agent, or Firm* — Brinks Gilson & Lione

(57) ABSTRACT

The present disclosure provides a semiconductor structure and a method for forming a semiconductor structure. In one form, a method for forming a semiconductor structure includes: providing a base; forming multiple spaced filling layers in the base; etching the base to form multiple independent fin portions; and etching the filling layers to form multiple independent pseudofin portions. In one form a semiconductor structure of the present disclosure includes: a substrate, multiple independent fin portions and multiple independent pseudofin portions, wherein the substrate includes device areas, and isolating areas located between the device areas; the multiple independent fin portions are located on the substrate in the device areas and are the same with the substrate in material; and the multiple independent pseudofin portions are located on the substrate in the isolating areas and are different from the substrate in material.

8 Claims, 10 Drawing Sheets

(51) Int. Cl.
*H01L 21/308* (2006.01)
*H01L 21/306* (2006.01)
(52) U.S. Cl.
CPC .... *H01L 21/76224* (2013.01); *H01L 29/0653* (2013.01); *H01L 29/7851* (2013.01)

SEMICONDUCTOR STRUCTURE AND FORMING METHOD THEREOF

RELATED APPLICATIONS

The present application claims priority to Chinese Patent Appln. No. 201810733462.2, filed Jul. 5, 2018, the entire disclosure of which is hereby incorporated by reference.

BACKGROUND

Technical Field

The present disclosure relates to the technical field of semiconductors, and particularly relates to a semiconductor structure and a forming method thereof.

Related Art

In semiconductor manufacture, along with the development trend of super-large-scale integrated circuits, the feature size of the integrated circuits is continuously reduced. In order to adapt to smaller feature size, a channel length of a metal-oxide-semiconductor field-effect transistor (MOSFET) is also regularly shortened. However, along with the shortening of the channel length of a device, a distance between a source electrode and a drain electrode of the device is accordingly shortened. Therefore, a control capacity of a gate structure on channels becomes poorer, a difficulty of pinching off a channel by gate voltage becomes higher and higher, and the phenomenon of subthreshold leakage, that is, the so-called short-channel effects (SCE), occurs more easily.

To better adapt to reduction of feature sizes, the semiconductor process gradually starts to transition from a plane MOSFET to a three-dimensional transistor with higher efficacy, fox example, FinFET. In FinFET, the gate structure is at least capable of controlling ultrathin bodies (fin portion) from two sides, and compared with the plane MOSFET, the control capacity of the gate structure over channels is stronger, which can better inhibit the short-channel effects. Moreover, FinFET has better compatibility with manufacture of existing integrated circuits in comparison with other devices.

When the advancement of the Moore's Law is irreversible, a self-aligned double patterned technology (SADP) is widely applied to a forming process of the FinFET, and a fin cut last method is also an indispensable process step in the FinFET forming process.

SUMMARY

The present disclosure aims at providing a semiconductor structure and a forming method thereof, so as to optimize the electrical property of the semiconductor structure.

To address the above-mentioned problem, the present disclosure provides a forming method of a semiconductor structure. One form of the method comprises: providing a base; forming multiple spaced filling layers in the base; etching the base, to form multiple independent fin portions; and etching the filling layers, to form multiple independent pseudofin portions.

In some implementations, the filling layers are insulating layers; a substrate is located at bottoms of the fin portions or the pseudofin portions after etching; and the forming method also comprises: after the fin portions and the pseudofin portions are formed, forming isolating layers on the substrate exposed from the fin portions and the pseudofin portions, wherein tops of the isolating layers are lower than tops of the fin portions.

In some implementations, the filling layers are semiconductor layers different from the base in material; and the pseudofin portions comprise top pseudofin portions formed by the filling layers; and the forming method also comprises: removing the top pseudofin portions after the fin portions and the pseudofin portions are formed.

In some implementations, the substrate is located at the bottoms of the fin portions or the pseudofin portions after etching; and the isolating layers are formed on the substrate exposed from the fin portions after the top pseudofin portions are removed.

In some implementations, the step of etching the filling layers to form multiple independent pseudofin portions comprises: etching the filling layers and the base located below the filling layers, to form the pseudofin portions, and the pseudofin portions also comprise bottom pseudofin portions located below the top pseudofin portions and formed by the base; and the step of forming the isolating layers comprises: covering the bottom pseudofin portions with the isolating layers, wherein the tops of the isolating layers are lower than the tops of the fin portions.

In some implementations, the base and the filling layers are etched in the same etching step, so as to form the fin portions and the pseudofin portions.

In some implementations, the step of forming the fin portions and the pseudofin portions comprises: forming a mask material layer covering the base and the filling layers; forming multiple independent core layers on the mask material layer; forming mask side walls covering the side walls of the core layers; removing the core layers after the mask side walls are formed; etching the mask material layer by taking the mask side walls as a mask after the core layers are removed, and taking the residual mask material layer after etching as a mask layer; and etching the base and the filling layers by taking the mask layer as the mask, to form the fin portions and the pseudofin portions.

In some implementations, the step of etching the filling layers to form multiple independent pseudofin portions comprises: etching the filling layers of partial thickness to form multiple independent pseudofin portions.

In some implementations, the step of etching the filling layers to form multiple independent pseudofin portions comprises: etching the filling layers until the base below the filling layers is exposed, to form multiple independent pseudofin portions.

In some implementations, the step of etching the filling layers to form multiple independent pseudofin portions comprises: etching the filling layers and etching a part of the base below the filling layers, to form multiple independent pseudofin portions.

In some implementations, the step of forming the filling layers comprises: forming multiple spaced grooves in the base; filling the grooves with a filling material layer; and performing flattening processing on the filling material layer.

In some implementations, a process of filling the grooves with the filling material layer is mobile chemical vapor deposition.

The present disclosure also provides a semiconductor structure. In one form, the semiconductor structure comprises: a substrate, wherein the substrate comprises device areas and isolating areas located between the device areas; multiple independent fin portions, which are located on the substrate in the device areas and are the same as the substrate in material; and multiple independent pseudofin portions, which are located on the substrate in the isolating areas and are different from the substrate in material.

In some implementations, the semiconductor structure also comprises isolating structures located in the substrate below the pseudofin portions, and the width of the isolating structures is greater than the width of the pseudofin portions.

In some implementations, the pseudofin portions comprise bottom pseudofin portions and top pseudofin portions located on the bottom pseudofin portions, and the bottom pseudofin portions and the substrate are of an integrated structure.

In some implementations, the bottom surfaces of the pseudofin portions are in contact with the surface of the substrate.

In some implementations, the semiconductor structure also comprises isolating layers, where the isolating layers are located on the substrate exposed from the fin portions and the pseudofin portions, and the isolating layers cover a part of side walls of the pseudofin portions.

In some implementations, the semiconductor structure also comprises isolating layers, where the isolating layers are located on the substrate exposed from the fin portions and the pseudofin portions, and the isolating layers cover the bottom pseudofin portions and cover a part of side walls of the top pseudofin portions.

In some implementations, the material of the pseudofin portions is an insulating material or a semiconductor material different from that of the substrate.

In some implementations, the material of the top pseudofin portions is an insulating material or a semiconductor material different from that of the substrate.

Compared with the prior art, the technical scheme of the present disclosure has at least the following advantages: according to the semiconductor structure and the forming method thereof, the base is etched to form multiple independent fin portions, and the filling layers are etched to form the pseudofin portions. Because the filling layers are distributed at intervals, the pseudofin portions are located between the fin portions and play a support role between the fin portions. In this way, in the subsequent process of forming the isolating layers, because the distance difference between the fin portions or between the fin portions and the pseudofin portions is not great, the problem of non-uniform thickness of the isolating layers is hard to cause, and therefore, the possibility that the fin portions are bent or inclined is relatively low, and then further improvement of the properties and property uniformity of devices is facilitated.

Moreover, in the subsequent steps, if the pseudofin portions are removed, because the material of the pseudofin portions is different from the material of the fin portions, the height uniformity of the semiconductor structure is relatively good after the pseudofin portions are removed. And the isolating layers covering the substrate are formed after the pseudofin portions are removed, so as to reduce the occurrence of the phenomenon that the substrate is exposed from the isolating layers. Thus, the problem of leakage of the devices is alleviated, and improvement of the properties of the devices is facilitated, and therefore, the property uniformity is improved.

DETAILED DESCRIPTION

Analysis will be performed on the reasons that the electrical property of a semiconductor structure needs to be improved in combination with a method for forming a semiconductor structure.

Figure 1:
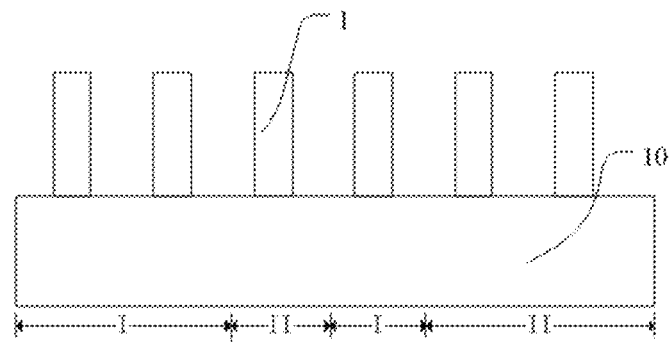
FIG. 1 to FIG. 2 are structure schematic diagrams corresponding to steps in a method for forming a semiconductor structure.
Figure 2:
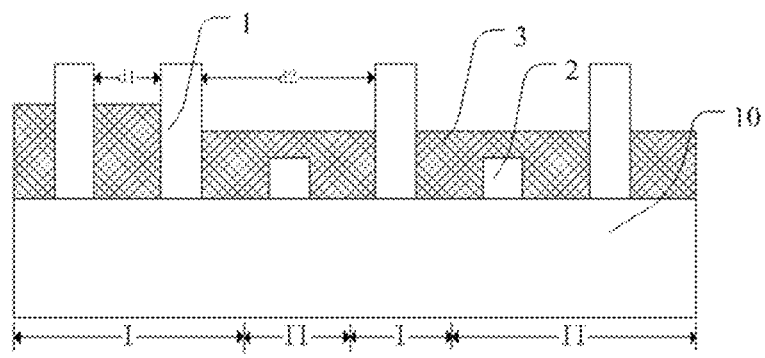

FIG. 1 and FIG. 2 show structure schematic diagrams corresponding to steps in a method of forming a semiconductor structure.

Referring to FIG. 1, a self-aligned double patterned (SADP) technology is adopted to form a substrate 10 and multiple independent fin portions 1 located on the substrate 10, where the substrate 10 includes device areas I and isolating areas II.

Referring to FIG. 2, the fin portions 1 of partial thickness of the isolating areas II are removed by etching to form residual fin portions 2, and the fin portion 1 remaining in the device areas I are used for forming a FinFET.

Referring to FIG. 2, the step of forming isolating structures 3 on the substrate 10 exposed from the fin portions 1, may include: covering isolating layers first, performing flattening processing on the isolating layers, and re-etching the isolating layers, where the residual isolating layers are used for forming the isolating structures.

As shown in FIG. 2, the distance between the fin portions 1 located in the same device area is d1, the distance between the fin portions 1 of adjacent device areas is d2, and d2 is far greater than d1. When the isolating structures 3 are formed, the difficulty of removing the isolating layers in the flattening and re-etching process of the fin portions with relatively short distance is relatively great, the removal rate is relatively low, and therefore, the thickness of the isolating structures finally formed in distance d1 is relatively great. Correspondingly, the difficulty of removing the isolating layers in the flattening and re-etching process of the fin portions with relatively long distance is relatively great, the removal rate is relatively high, and therefore, the thickness of the isolating structures finally formed in distance d2 is relatively small. In this way, the thicknesses of the isolating layers at two sides of the fin portions 1 are different, the stress born by the fin portions 1 is accordingly different, and the possibility that the fin portions 1 are bent or inclined is relatively high, which affects the electric property of the semiconductor structure.

Figure 3:
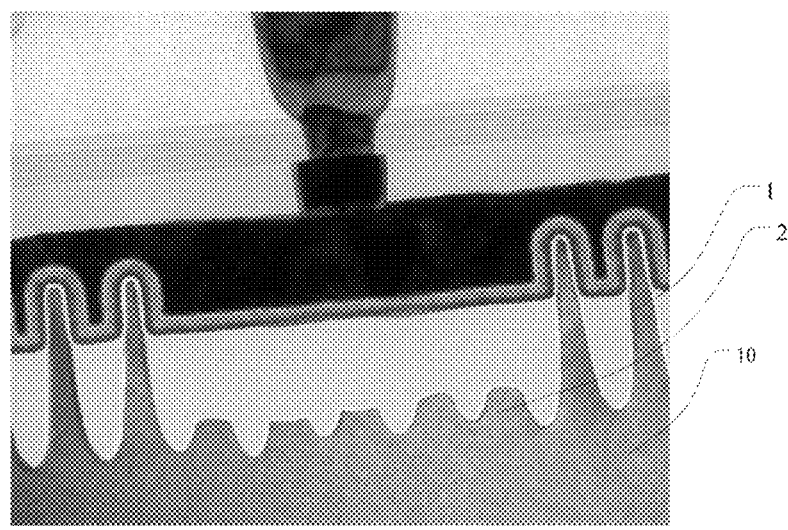
FIG. 3 to FIG. 4 are electron microscope diagrams of the semiconductor structure formed by adopting the forming method of FIG. 1 to FIG. 2.
Figure 4:
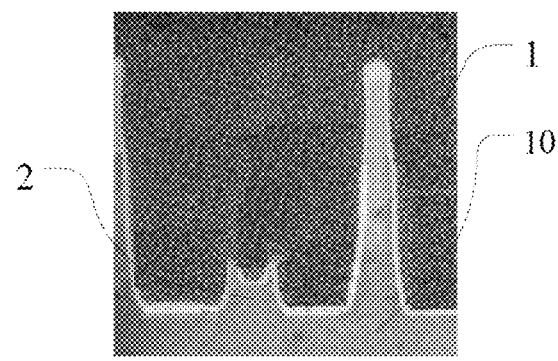

Referring to FIG. 3 and FIG. 4 in combination, electron microscope diagrams of the semiconductor structure formed by adopting the forming method are shown. After the fin portions 1 of partial thickness of the isolating areas II are removed, the residual fin portions 2 easily have the problem of rugged top surfaces (as shown in FIG. 3), and even have the problem of incomplete etching (as shown in FIG. 4). In the subsequent process of forming the isolating structures 3 on the substrate exposed from the fin portions 1 and the residual fin portions 2, a condition that the isolating structures 3 are exposed from the top ends of the residual fin portions 2 occurs, and these conditions cause the residual fin portions 2 in the devices to have the problem of leakage.

To address the technical problem, the present disclosure provides a method for forming a semiconductor structure. In one form, the method includes: providing a base; forming multiple spaced filling layers in the base; etching the base, to form multiple independent fin portions; and etching the filling layers, to form multiple independent pseudofin portions.

In forms of the semiconductor structure and methods for forming the semiconductor structure, the base is etched to form multiple independent fin portions, where the filling layers are etched to form the pseudofin portions. Because the filling layers are distributed at intervals, the pseudofin portions are located between the fin portions and play a support role between the fin portions. In this way, in the subsequent process of forming the isolating layers, because the distance difference between the fin portions or between the fin portions and the pseudofin portions is not great, the problem of non-uniform thickness of the isolating layers is hard to cause, and therefore, the possibility that the fin portions are bent or inclined is relatively low, and then further improvement of the properties and property uniformity of devices is facilitated.

In addition, in subsequent steps, if the pseudofin portions are removed, because the material of the pseudofin portions is different from the material of the fin portions, the height uniformity of the semiconductor structure is relatively good after the pseudofin portions are removed. And the isolating layers covering the substrate are formed after the pseudofin portions are removed, so as to reduce the occurrence of the phenomenon that the substrate is exposed from the isolating layers. Thus, the problem of leakage of the devices is relived, and further, the improvement of the properties of the devices is facilitated, and therefore, the property uniformity is improved.

To make the foregoing objectives, features, and advantages of the present disclosure more comprehensible, detailed description is made to specific embodiments and implementations of the present disclosure in combination with accompanying drawings.

FIG. 5 to FIG. 13 are structure schematic diagrams corresponding to steps in a first form of a method for forming a semiconductor structure.

Figure 5:
FIG. 5 to FIG. 13 are structure schematic diagrams corresponding to steps in a first form of a method for forming a semiconductor structure of the present disclosure.
Figure 6:
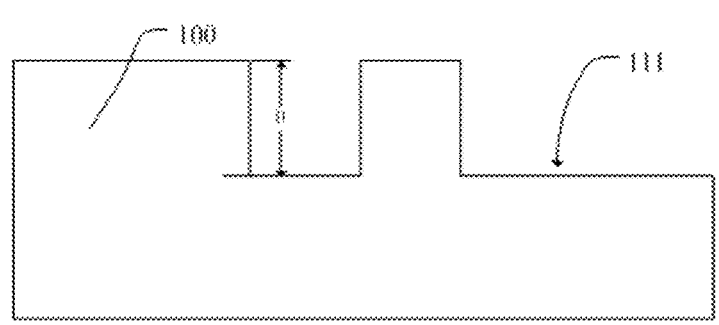
Figure 7:
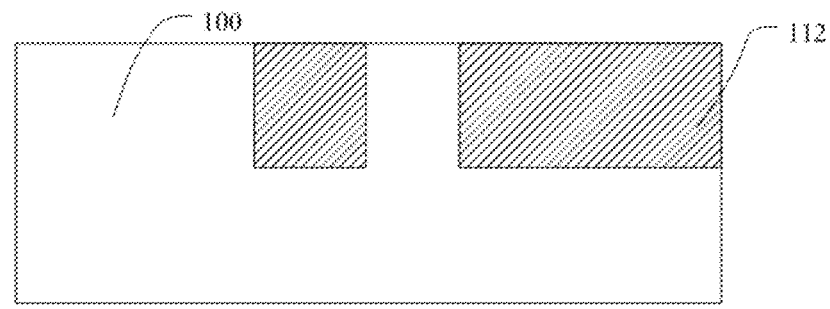

Referring to FIG. 5 to FIG. 7, a base 100 is provided, and multiple spaced filling layers 112 are formed in the base 100.

As shown in FIG. 5, the base 100 is provided, and the base 100 provides a technical platform for forming the substrate and the fin portions in the subsequent processes.

In some implementations, the material of the base 100 is silicon, where in other implementations, the material of the base 100 is germanium, silicon carbide, gallium arsenide or indium gallide, and the base 100 is a silicon base on an insulator or a germanium base on an insulator.

As shown in FIG. 6, multiple spaced grooves 111 are formed in the base 100 (as shown in FIG. 5). The grooves 111 provide a space position for forming the filling layers in the subsequent processes.

In some implementations, the base 100 is etched to form grooves 111 in the base 100. Specifically, in order to improve the appearance quality of the grooves 111, the step of forming the grooves 111 in the base 100 includes: etching the base 100 by a dry etching process. In other implementations, a wet etching process or a process combining the wet etching process with the dry etching process is adopted, so as to remove a part of materials of the base 100.

In some implementations, the depth D of the grooves 111 is greater than the design height of the pseudofin portions.

Referring to FIG. 7, the grooves 111 (as shown in FIG. 6) are filled with the filling layers 112.

In the subsequent processes, the filling layers 112 of partial thickness are etched to form the pseudofin portions, and the pseudofin portions include top pseudofin portions formed by the material of the filling layers.

Specifically, the step of filling the grooves 111 with the filling layers 112 includes: filling the grooves 111 with the filling material layer; performing flattening processing on the filling material layer, removing the filling material layer located at the top of the base 100, and taking the residual filling material layers as the filling layers 112.

In some implementations, the material of the filling layers 112 is an insulating material, and the insulating material plays a role of isolating adjacent devices. In some implementations, the material of the filling layers 112 is silicon oxide or silicon oxynitride.

In some implementations, the process of filling the grooves with the filling material layers is mobile chemical vapor deposition.

Figure 9:
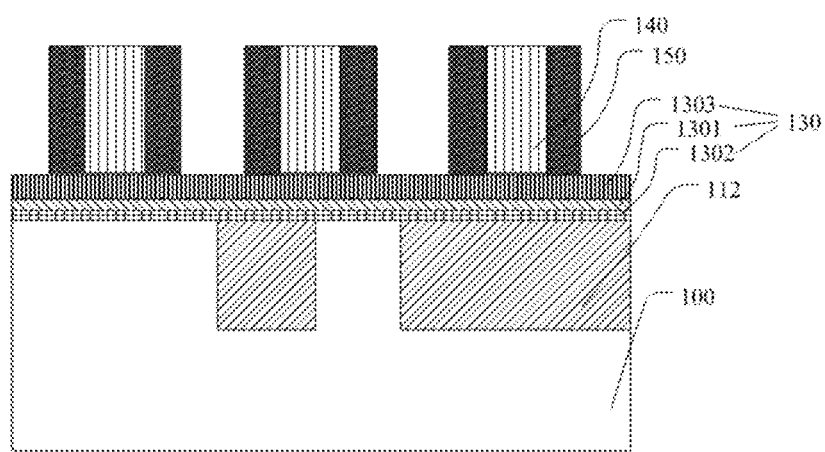
Figure 10:
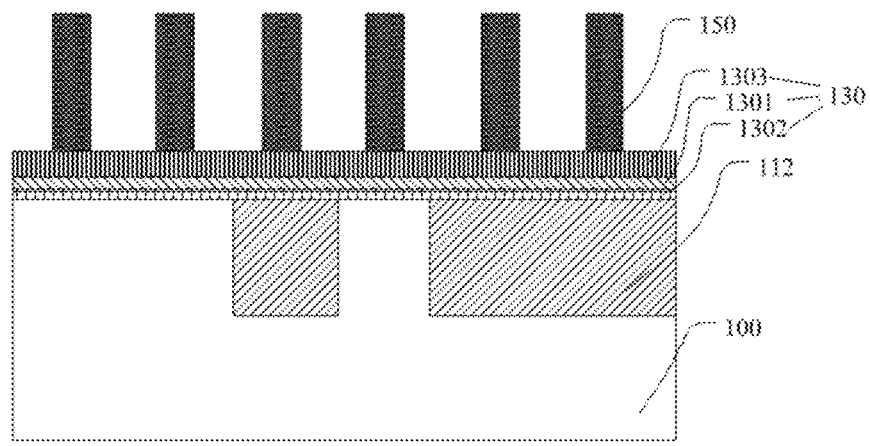
Figure 11:
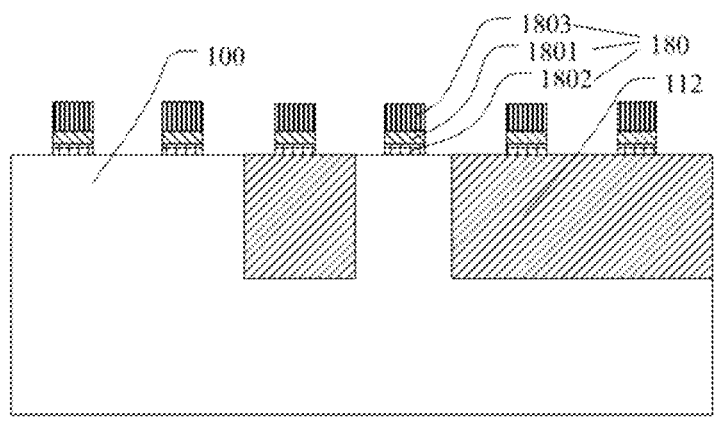

Referring to FIG. 8 to FIG. 12, the base 100 is etched (as shown in FIG. 11) to form multiple independent fin portions 121 on the residual base, and the filling layers (as shown in FIG. 11) of partial thickness are etched, so as to form multiple independent pseudofin portions 113.

In some implementations, the pseudofin portions 113 are integrally formed by etched filling layers 112. The pseudofin portions 113 are made from the insulating material. Because the pseudofin portions 113 are non-conductive, and do not have functionality, the pseudofin portions 113 are not removed in the subsequent steps.

In addition, the semiconductor structure also includes isolating structures 114 located in the substrate below the pseudofin portions 113, the width of the isolating structures 114 is greater than the width of the pseudofin portions 113, and the isolating structures 114 are formed by the filling layers 112 which are not completely etched.

In some implementations, the fin portions 121 and the pseudofin portions 113 are formed by a multiple patterned technology. Specifically, the multiple patterned technology is the self-aligned double patterned technology.

Figure 8:
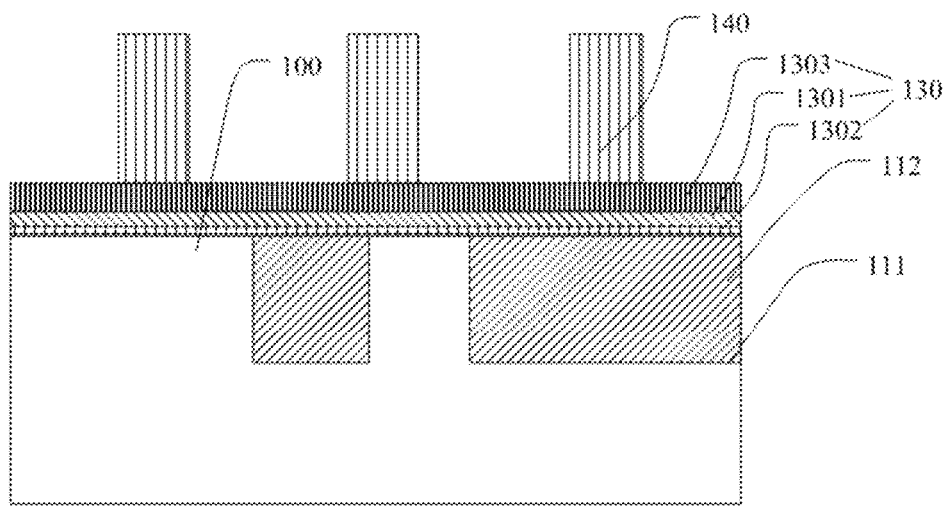

As shown in FIG. 8, a mask material layer 130 (as shown in FIG. 8) covering the base 100 and the filling layers 112 is formed, and multiple independent core layers 140 (as shown in FIG. 8) are formed on the mask material layer 130.

In some implementations, the mask material layer 130 is of a laminated structure, and includes a base protective material layer 1302, a hard mask material layer 1301 formed on the base protective material layer 1302 and a high-performance metal oxidizing material layer 1303 are formed on the hard mask material layer 1301.

The base protective material layer 1302 is used for reducing the influence of the stress of the hard mask material layer 1301 on the base 100. The high-performance metal oxidizing material layer 1303 is used for protecting the hard mask material layer 1301, and when the core layers 140 and mask side walls 150 are removed in the subsequent process, damage to the hard mask material layer 1301 is reduced.

In some implementations, the material of the base protective material layer 1302 is silicon oxide. In some implementations, the material of the hard mask material layer 1301 is silicon nitride. In other implementations, the material of the hard mask material layer 1301 is silicon carbide, carbon silicon nitride, carbon silicon oxynitride, silicon oxynitride, boron nitride or carbon boron nitride.

In some implementations, the material of the high-performance metal oxidizing material layer 1303 is silicon oxide. In other implementations, the material of the high-performance metal oxidizing material layer 1303 is also silicon nitride or silicon oxynitride.

The material of the core layers 140 is a material which is easily removed, and the material of the core layers 140 is different from the material of the mask material layer 130, so as to reduce the damage of the process of removing the core layers 140 to the mask material layer 130.

In some implementations, the material of the core layers 140 is polycrystalline silicon. In other implementations, the material of the core layers 140 is also amorphous carbon, ODL material, DARC material or BARC material.

The mask side walls 150 covering the side walls of the core layers 140 are formed.

The material of the mask side walls 150 is different from the material of the high-performance metal oxidizing material layer 1303, and the material of the mask side walls 150 is silicon oxide, silicon nitride, silicon oxynitride, silicon carbide, carbon silicon oxide, carbon silicon nitride, carbon silicon oxynitride or boron nitride. In some implementations, the material of a side wall layer 206 is silicon nitride.

As shown in FIG. 10, after the mask side walls 150 are formed, the core layers 140 (as shown in FIG. 9) are removed; and after the core layers 140 are removed, the mask side walls 150 are taken as the mask.

A part of the mask material layer 130 is exposed by removing the core layers 140, so as to realize etching of the mask material layer 130 in the subsequent processes.

In some implementations, the core layers 140 are removed by adopting dry etching, and in other implementations, the wet etching process or a process combining the wet etching process with the dry etching process is adopted.

As shown in FIG. 11, the mask material layer 130 (as shown in FIG. 10) is etched, and the residual mask material layer 130 after etching is taken as mask layers 180.

In some implementations, the mask material layer 130 is of a laminated structure, and correspondingly, the mask layers 180 are also of a laminated structure. Further, each mask layer 180 includes a base protective layer 1802 (as shown in FIG. 11), a hard mask layer 1801 (as shown in FIG. 11) is formed on the base protective layer 1802 and a high-performance metal oxidizing layer 1803 is formed on the hard mask layer 1801.

After the mark layers 180 are formed, the method may also include: removing the mask side walls 150 (as shown in FIG. 10); and after the mask side walls 150 are removed, removing the high-performance metal oxidizing layer 1803 in the mask layers 180.

Figure 12:
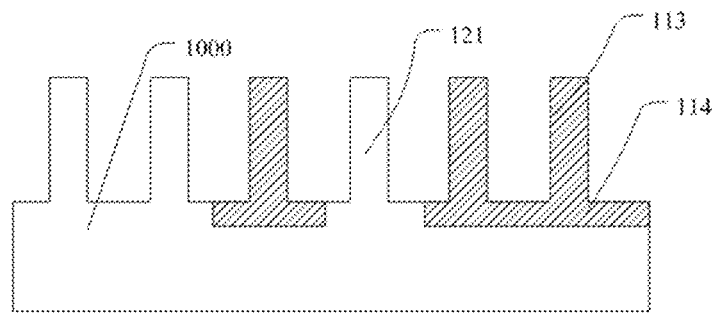

Referring to FIG. 12, by taking the hard mask layer 1801 as a mask, the base 100 is etched (as shown in FIG. 11) to form the multiple independent fin portions 121, and the filling layers 112 (as shown in FIG. 11) of partial thickness are etched to form multiple independent pseudofin portions 113.

Specifically, in the step of forming the fin portions 121, by taking the hard mask layer 1801 as a mask, the base 100 is etched; and in the step of forming the pseudofin portions 113, by taking the hard mask layer 1801 as a mask, the filling layers 112 of partial thickness are etched.

In some implementations, in order to simplify the process steps of forming the fin portions 121 and the pseudofin portions 113, and reduce the process cost and process time, the base 100 and the filling layers 112 of partial thickness are etched in the same etching step. In order to reduce the technical difficulty of forming the fin portions 121 and the pseudofin portions 113, and improve the diagram density uniformity of the fin portions 121 and the pseudofin portions 113, the heights of the fin portions 121 and the pseudofin portions 113 in the pseudofin portions 113 tend to be the same.

In some implementations, the step of forming the pseudofin portions 113 includes: etching the filling layers 112 of partial thickness to form the pseudofin portions 113.

The semiconductor structure may also include: the residual non-etched filling layers 112 are used for forming the isolating structures 114 located below the pseudofin portions 113, the pseudofin portions 113 are formed on the isolating structures 114, the isolating structures 114 are reserved, and the height of the isolating structures 114 is greater than the width of the pseudofin portions 113.

In some implementations, the isolating structures 114 are located on the substrate 1000 between the adjacent fin portions 121, so as to further isolate devices formed by the adjacent fin portions 121, and further be beneficial to further improvement of the properties of the devices. The isolating structures 114 are located between the pseudofin portions 113 and the substrate 1000, that is, the top surface of the substrate below the fin portions 121 is higher than the top surface of the substrate below the pseudofin portions 113.

After the fin portions 121 and the pseudofin portions 113 are formed, the hard mask layer 1801 at the tops of the fin portions 121 and the pseudofin portions 113 is reserved. In the subsequent process of the flattening processing, the top surface of the hard mask layer 1801 is used for defining the stop position of the flattening processing, and plays the role of protecting the tops of the fin portions 121 and the tops of the pseudofin portions 113.

In some implementations, the base 100 and the filling layers 112 of partial thickness are etched in the same etching step. In other implementations, the fin portions and the pseudofin portions 113 are also formed in different etching steps.

Specifically, the step of forming the pseudofin portions includes: after the fin portions are formed, forming shielding layers covering the fin portions; after the shielding layers are formed, etching the filling layers of partial thickness, to form the pseudofin portions; and then removing the shielding layers.

Or, after the pseudofin portions are formed, the shielding layers covering the pseudofin portions are formed; and after the shielding layers are formed, the base is etched, to form the fin portions; and the shielding layers are removed.

Figure 13:
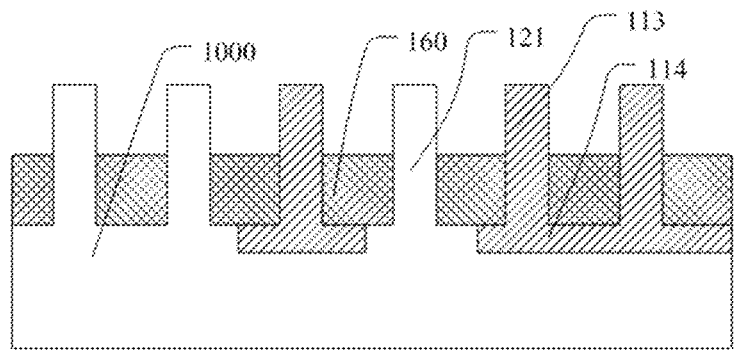

Referring to FIG. 13, after the fin portions 121 and the pseudofin portions 113 are formed, isolating layers 160 are formed on the substrate 1000, where the tops of the isolating layers 160 are lower than the tops of the fin portions 121.

The isolating layers 160 are used for isolating adjacent devices.

Specifically, the step of forming the isolating layers 160 on the substrate 1000 may include: forming isolating membranes on the substrate 1000 exposed from the fin portions and the pseudofin portions 113, covering the hard mask layer 1801 (as shown in FIG. 12) with the isolating membranes, performing flattening processing on the isolating membranes, and removing the isolating membranes higher than the top of the hard mask layer 1801; after the flattening processing is performed on the isolating membranes, re-etching the residual isolating membranes of partial thickness, and taking the residual isolating membranes after re-etching processing as the isolating layers 160; and removing the hard mask layer 1801 on the tops of the fin portions 121 and the pseudofin portions 113 and the base protective layer 1802 (as shown in FIG. 11).

In some implementations, the material of the isolating layers 160 is silicon oxide. In other implementations, the material of the isolating layers 160 is other insulating materials such as silicon nitride or silicon oxynitride.

According to forms of the semiconductor structure and forms of the method for forming a semiconductor structure, the base is etched to form multiple independent fin portions 121, the filling layers 112 of partial thickness are etched to form the pseudofin portions 113, and the isolating structures 114 are formed at the bottom ends of the pseudofin portions 113. Because the fin portions 121 are distributed at intervals, the pseudofin portions 113 are located between the fin portions 121, and the pseudofin portions 113 play a support role among the fin portions 121. Therefore, in the subsequent process of forming the isolating layers 160, because the distance difference between the fin portions 121 or between the fin portions 121 and the pseudofin portions 113 is not great, the problem of non-uniform thickness of the isolating layers 160 is hard to cause, and then the possibility that the fin portions 121 are bent or inclined is relatively low, and further improvement of the properties and property uniformity of the devices is facilitated.

Figure 14:
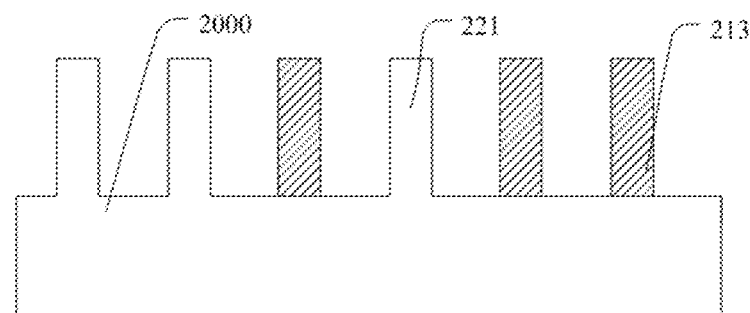
FIG. 14 to FIG. 15 are structure schematic diagrams corresponding to steps in a second form of a method for forming a semiconductor structure of the present disclosure.
Figure 15:
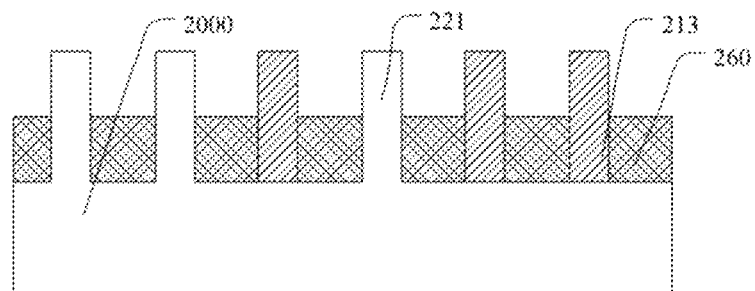

FIG. 14 to FIG. 15 are structure schematic diagrams corresponding to steps in a second form of a method for forming a semiconductor structure.

Similarities of implementations described below with respect to the second form and the implementations describes above with respect to the first form are not further described herein. One difference between the implementations of the second form and the implementations of the first form is that: referring to FIG. 14, the step of forming pseudofin portions 213 includes: etching filling layers until the base below the filling layers is exposed, so as to form multiple pseudofin portions 213.

That is, the filling layers are etched just until the base is exposed, so as to form the pseudofin portions 213 equivalent to the filling layers.

The etched base is a substrate 2000, and the bottoms of fin portions 221 are in contact with the surface of the substrate.

The fin portions 221 and the pseudofin portions 213 are formed in the same step, and the height of the fin portions 221 tends to be the same as the height of the pseudofin portions 213, so as to improve the diagram density uniformity of the fin portions 221 and the pseudofin portions 213. In other implementations, the fin portions and the pseudofin portions are also formed in different steps.

Referring to FIG. 15, isolating layers 260 are formed on the substrate 2000 exposed from the fin portions 221 and the pseudofin portions 213, the isolating layers 260 cover the substrate 2000 exposed from the fin portions 221 and the pseudofin portions 213, and the tops of the isolating layers 260 are lower than the tops of the fin portions 221.

According to forms of the semiconductor structure and forms of the method for forming a semiconductor structure, the base is etched to form multiple independent fin portions 221, and the filling layers are etched until the base below the filling layers is exposed to form the pseudofin portions 213, that is, the pseudofin portions 213 are formed by a filling layer material. Because the filling layers are distributed at intervals, the pseudofin portions 213 are located between the fin portions 221 and play a support role between the fin portions 221. In this way, in the subsequent process of forming the isolating layers 260, because the distance difference between the fin portions 221 and between the fin portions 221 and the pseudofin portions 213 is not great, the problem of non-uniform thickness of the isolating layers 260 is hard to cause, and therefore, the possibility that the fin portions 221 are bent or inclined is relatively low, and further improvement of the properties and property uniformity of devices is facilitated.

In some implementations, the forming method of the isolating layers 260 and the corresponding effect are the same as those of the implementations of the first form, and are not further described herein.

Specific descriptions of the method for forming a semiconductor structure are available in reference to related descriptions of the first form described above, and are not further described herein.

Figure 16:
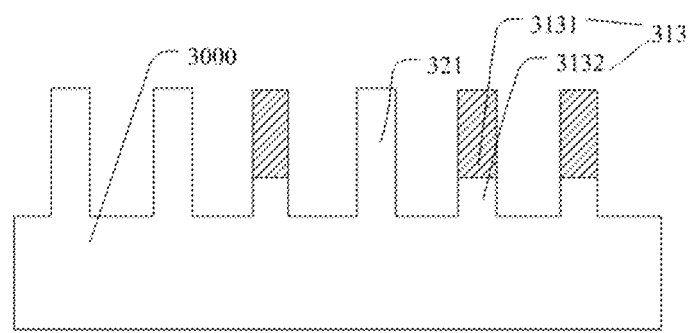
FIG. 16 to FIG. 17 are structure schematic diagrams corresponding to steps in a third form of a method for forming a semiconductor structure of the present disclosure.
Figure 17:
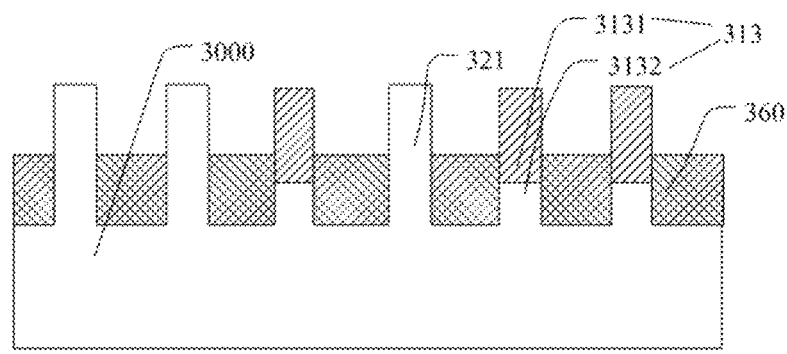

FIG. 16 to FIG. 17 are structure schematic diagrams corresponding to steps in a third form of a method for forming a semiconductor structure of the present disclosure.

Similarities of implementations of the third form and implementations of the first embodiment are not further described herein. One difference between implementations of the third form and implementations of the first form is that: referring to FIG. 16, the step of forming pseudofin portions 313 includes: etching filling layers and etching a part of a base below the filling layers, so as to form multiple independent pseudofin portions 313.

Specifically, the filling layers and the base of partial thickness below the filling layers are sequentially etched, and multiple independent bulges are formed on the substrate 3000, where the bulges are used as the pseudofin portions 313, the pseudofin portions 313 include bottom pseudofin portions 3132 formed by etching the base and top pseudofin portions 3131 located on the bottom pseudofin portions 3132, and the top pseudofin portions 3131 are formed by etching the filling layers. In some implementations, because the top pseudofin portions 3131 are formed by etching the filling layers, the material of the top pseudofin portions 3131 is a filling layer material, and the material of the filling layers is an insulating material.

In some implementations, in order to simplify the process step of forming fin portions 321 and the pseudofin portions 313, and reduce the process cost and process time, the base and the filling layers are etched in the same etching step.

In some implementations, the height of the fin portions 321 and the height of the pseudofin portions 313 tend to be the same, the top surface of the substrate at the bottom ends of the fin portions 321 tends to be flush with the top surface of the substrate at the bottom ends of the pseudofin portions 313, so as to reduce the technical difficulty for forming the fin portions 321 and the pseudofin portions 313, and improve the diagram density uniformity of the fin portions 321 and the pseudofin portions 313. In other implementations, the fin portions and the pseudofin portions are also formed in different etching steps.

Referring to FIG. 17, after the fin portions 321 and the pseudofin portions 313 are formed, isolating layers 360 are formed on the substrate 3000, where the isolating layers 360 cover the substrate exposed from the fin portions 321 and the pseudofin portions 313, and the isolating layers 360 cover the side walls of the bottom pseudofin portions 3132, and a part of side walls of the top pseudofin portions 3131.

According to forms of the semiconductor structure and forms of the forming method thereof, the base is etched to form multiple independent fin portions 321, and the filling layers are etched and a part of the base below the filling layers is etched to form multiple independent pseudofin portions 313, the pseudofin portions 313 include bottom pseudofin portions 3132 formed by etching the base and top pseudofin portions 313 located on the bottom pseudofin portions 3132. And because the filling layers are distributed at intervals, the pseudofin portions 313 are located between the fin portions 321 and play a support role between the fin portions 321. In this way, in the subsequent process of forming the isolating layers 360, because the distance difference between the fin portions 321 and between the fin portions 321 and the pseudofin portions 313 is not great, the problem of non-uniform thickness of the isolating layers 360 is hard to cause, and therefore, the possibility that the fin portions 321 are bent or inclined is relatively low, and further improvement of the properties and property uniformity of devices is facilitated.

Specific descriptions of the forming method of the isolating layers 360 of the present form are available in reference to related descriptions of the implementations of the first form, and are not further described herein.

Figure 18:
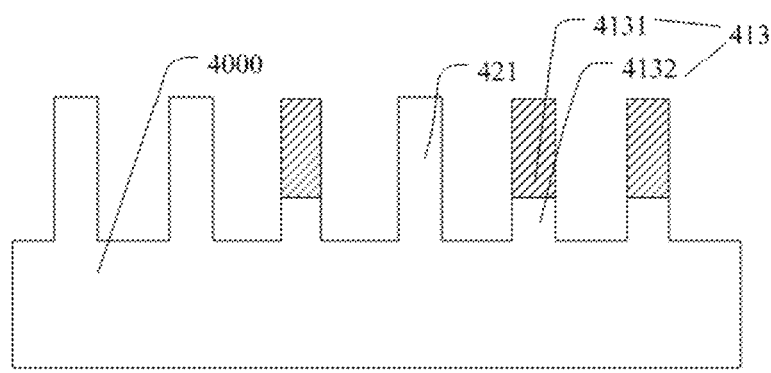
FIG. 18 to FIG. 20 are structure schematic diagrams corresponding to steps in a fourth form a method for forming a semiconductor structure of the present disclosure.
Figure 19:
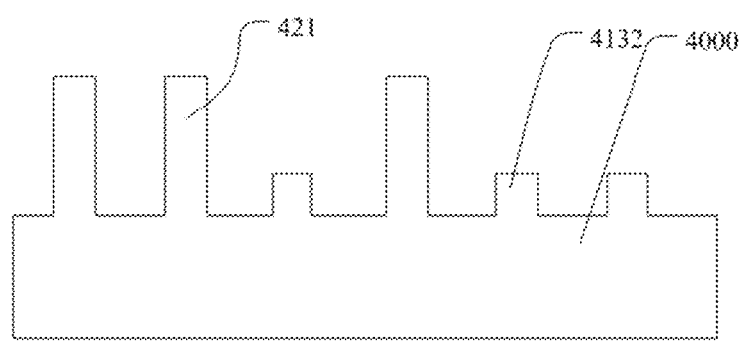
Figure 20:
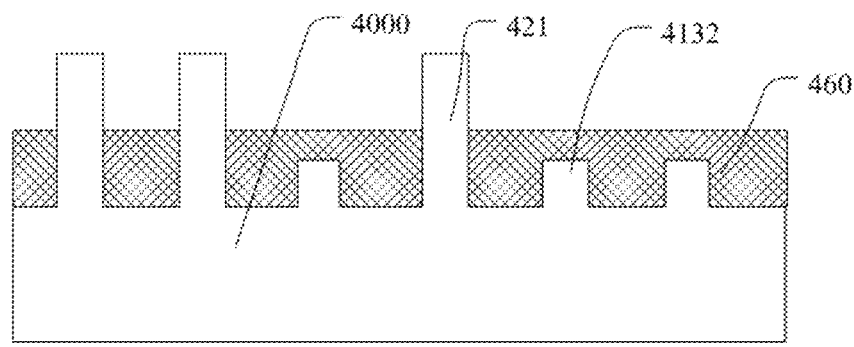

FIG. 18 to FIG. 20 are structure schematic diagrams corresponding to steps in a fourth form of a method for forming a semiconductor structure of the present disclosure.

Similarities of the present form and the implementations of the third form are not further described herein. The difference between the present form and the implementations of the third form is that: the material of filling layers is a semiconductor layer is different from the material of a base.

After pseudofin portions 413 (as shown in FIG. 18) and fin portions 421 (as shown in FIG. 18) are formed, and before isolating layers 460 (as shown in FIG. 20) are formed, the method also includes: removing top pseudofin portions 4131 (as shown in FIG. 18) in the pseudofin portions 413, so as to prevent the top pseudofin portions 4131 formed by a semiconductor layer from affecting the property of the semiconductor structure.

Referring to FIG. 18 after the pseudofin portions 413 are formed, the pseudofin portions 413 include bottom pseudofin portions 4132 and the top pseudofin portions 4131 located on the bottom pseudofin portions 4132, and the bottom pseudofin portions 4132 and a substrate 4000 are of an integrated structure.

Specific descriptions of process steps for forming the fin portions 421 and the pseudofin portions 413 are available in reference to corresponding descriptions of the implementations of the third form, and are not further described herein.

Referring to FIG. 19, the top pseudofin portions 4131 (as shown in FIG. 18) are removed.

In some implementations, the material of the etched filling layers is a semiconductor material with a high etching selection ratio with the base, that is, the material of the top pseudofin portions 4131 is the semiconductor material with the high etching selection ratio with the base, which reduces the technical difficulty of removing the top pseudofin portions 4131.

In some implementations, a wet etching process is adopted to remove the top pseudofin portions 4131, so as to prevent the bottom pseudofin portions 4132, the fin portions 421 and the substrate 4000 from the damage of plasma, and further reduce influence on the property of the device. When the material of the bottom pseudofin portions 4132 is silicon, the material of the top pseudofin portions 4131 is silicon germanide, and the top pseudofin portions 413 is etched by HCl steam. The difference value between the etching rate of HCl steam to a silicon germanide material and the etching rate of the HCl steam to a Si material is relatively great, and therefore, HCl steam is adopted to etch the top pseudofin portions 4131, so as to effectively reduce the possibility that the substrate 4000, the fin portions 421 and the bottom pseudofin portions 4132 are damaged, and also be beneficial to improvement of the properties and property uniformity of the devices.

In some implementations, the volume percentage concentration of the HCl steam is 3% to 20%.

Referring to FIG. 20, after the top pseudofin portions 4131 are removed, the isolating layers 460 on the substrate 4000 exposed from the fin portions 421 and the bottom pseudofin portions 4132 are formed, where the isolating layers 460 cover the substrate exposed from the fin portions 421 and the bottom pseudofin portions 4132, the isolating layers 460 cover the bottom pseudofin portions 4132, and the tops of the isolating layers 460 are lower than the tops of the fin portions 421.

In some implementations, the upper surfaces of the bottom pseudofin portions 4132 are the bottom surfaces of grooves obtained by etching the base originally, and because the flatness of the bottom surfaces of the grooves is higher than the flatness of the upper surfaces of the pseudofin portions obtained by etching each single fin portion, the flatness of the top surfaces of the bottom pseudofin portions 4132 is relatively high.

In subsequent steps, after the top pseudofin portions 4131 are removed, because the material of the top pseudofin portions 4131 is different from the material of the bottom pseudofin portions 4132, and the bottom pseudofin portions 4132 and the substrate are of an integrated structure, after the top pseudofin portions 4131 are removed, the height uniformity of the bottom pseudofin portions 4132 is relatively good, the isolating layers 460 covering the substrate are formed after the top pseudofin portions 4131 are removed, and the isolating layers 460 cover the bottom pseudofin portions 4132, so as to reduce the occurrence of the situation that the substrate is exposed from the isolating layers 460, and therefore, the problem of leakage of devices is relieved, improvement of properties of the devices is facilitated, and then the property uniformity is improved.

Specific descriptions of the forming method of the present form are available in reference to corresponding descriptions of the implementations of the third form, and are not further described herein.

Figure 21:
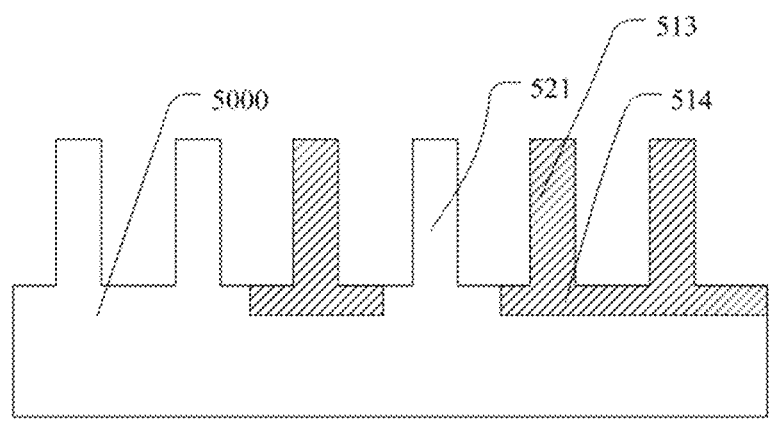
FIG. 21 to FIG. 23 are structure schematic diagrams corresponding to steps in a fifth form of a method for forming a semiconductor structure of the present disclosure.
Figure 22:
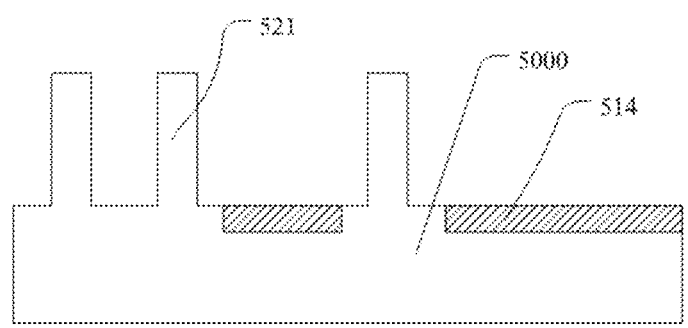
Figure 23:
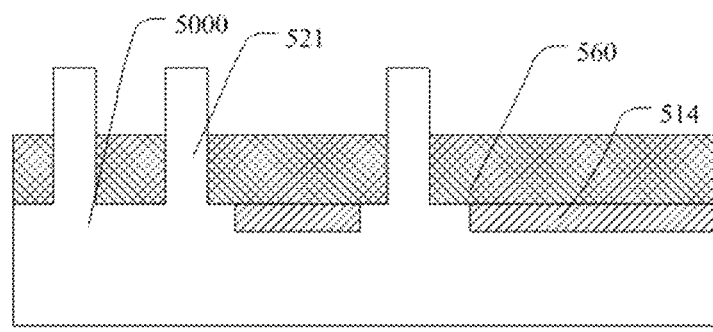

FIG. 21 to FIG. 23 are structure schematic diagrams corresponding to steps in a fifth form of a method for forming a semiconductor structure of the present disclosure.

Similarities of the present form and the implementations of the first form are not further described herein. The difference between the present form and the implementations of the first form is that: the material of filling layers is a semiconductor layer that is different from the material of a base.

After pseudofin portions 513 (as shown in FIG. 21) and fin portions 521 (as shown in FIG. 21) are formed, and before the isolating layers 560 (as shown in FIG. 23) are formed, the method also includes: removing the pseudofin portions 513, so as to prevent the pseudofin portions 513 formed by the semiconductor layer from affecting the forming of the semiconductor structure.

Specifically, referring to FIG. 21, after the pseudofin portions 513 are formed, the pseudofin portions 513 and isolating structures 514 located on a substrate 5000 are of an integrated structure.

Specific descriptions of process steps for forming the fin portions 521 and the pseudofin portions 513 are available in reference to corresponding descriptions of the implementations of the first form, and are not further described herein.

FIG. 22 is a structure schematic diagram (as shown in FIG. 21) after removal of the pseudofin portions 513.

In some implementations, the material of the etched filling layers is a semiconductor material with a high etching selection ratio with the base, that is, the material of the pseudofin portions 513 and the isolating structures 514 is the semiconductor material with the high etching selection ratio with a substrate 5000, which reduces the technical difficulty of removing the filling layers. When the material of the base is silicon, the material of the filling layers is silicon germanide.

In some implementations, a wet etching process is adopted to remove the pseudofin portions 513, so as to prevent the fin portions 521 and the substrate 5000 from the damage of plasma, and further reduce influence on the properties of the devices. Descriptions of specific process of removing the pseudofin portions 513 are available in reference to corresponding descriptions of the foregoing implementations of the fourth form, and are not further described herein.

Referring to FIG. 23, the pseudofin portions 513 are obtained by etching the filling layers, the pseudofin portions 513 and the isolating structures 514 are of an integrated structure. And because the flatness of the bottom surfaces of grooves is relatively high, the flatness of the contact surfaces of the isolating structures 514 and the substrate 5000 is relatively high. After the pseudofin portions 513 (as shown in FIG. 21) are removed, the isolating layers 560 are formed on the substrate 5000 exposed from the fin portions 521 and the isolating structures 514. Because the materials of the pseudofin portions 513 and the isolating structures 514 are both semiconductor materials, after the pseudofin portions 513 are removed, the isolating layers 560 cover the substrate 5000 and the isolating structures 514, so as to prevent the substrate 5000 from being exposed from the isolating layer 560, and effectively relieve the problem of leakage of the devices. The tops of the isolating layers 560 are lower than the tops of the fin portions 521.

In subsequent steps, after the pseudofin portions 513 are removed, because the material of the pseudofin portions 513 is different from the material of the fin portions, after the pseudofin portions 513 are removed, the flatness uniformity of the upper surfaces of the isolating structures 514 is relatively good, and the isolating layers 560 covering the substrate and the isolating structures 514 are formed after the pseudofin portions are removed, so as to reduce the occurrence of the situation that the substrate is exposed from the isolating layers 560, and therefore, the problem of leakage of the devices is relieved, improvement of the properties of the devices is facilitated, and then the property uniformity is improved.

Specific descriptions of the forming method of the present form are available in reference to related descriptions of the implementations of the first form, and are not further described herein.

Figure 24:
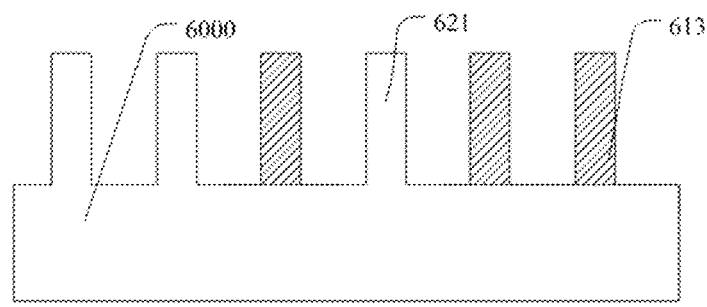
FIG. 24 to FIG. 26 are structure schematic diagrams corresponding to steps in a sixth form of a method for forming a semiconductor structure of the present disclosure.
Figure 25:
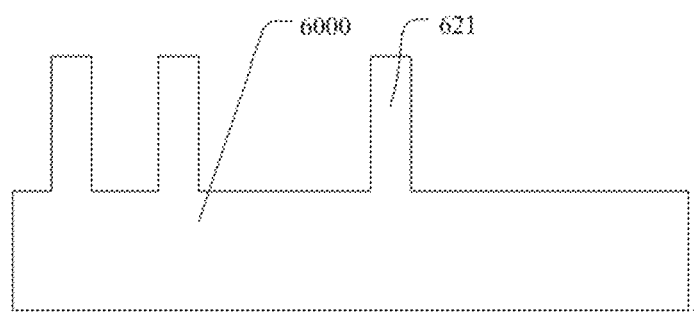
Figure 26:
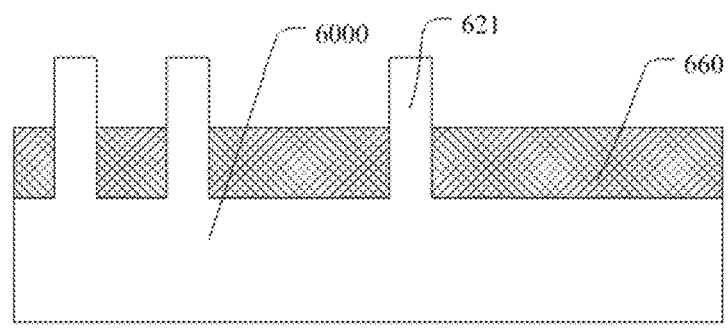

FIG. 24 to FIG. 26 are structure schematic diagrams corresponding to steps in a sixth form of a method for forming a semiconductor structure of the present disclosure.

Similarities of the present form and implementations of the second form are not further described herein. The difference between the present form and implementations of the second form is that: the material of filling layers is a semiconductor layer that is different from the material of a base.

After pseudofin portions 613 (as shown in FIG. 24) and fin portions 621 (as shown in FIG. 24) are formed, and before the isolating layers 660 (as shown in FIG. 26) are formed, the method also includes: removing the pseudofin portions 613 formed by a filling layer material, so as to prevent the pseudofin portions 513 formed by the semiconductor layer from affecting the property of the semiconductor structure.

Specific descriptions of process steps for forming the fin portions 621 and the pseudofin portions 613 are available in reference to corresponding descriptions of implementations of the second form, and are not further described herein.

Specifically, referring to FIG. 24 to FIG. 25, after the fin portions 621 and the pseudofin portions 613 are formed, the pseudofin portions 613 are removed.

In some implementations, the material of the filling layers is a semiconductor material with a high etching selection ratio with the base, that is, the etching selection ratio between the material of the pseudofin portions 613 and the material of a substrate 6000 is relatively high. When the material of the base is silicon, the material of the filling layers is silicon germanide. A wet etching process is adopted to remove the pseudofin portions 613, so as to prevent the fin portions 621 and the substrate 6000 from the damage of plasma, and further reduce the influence on the properties of the devices.

Descriptions of specific process of removing the pseudofin portions 613 are available in reference to corresponding descriptions of the foregoing implementations of the fourth form, and are not further described herein.

Referring to FIG. 26, after the pseudofin portions 613 (as shown in FIG. 25) are removed, the isolating layers 660 are formed on the substrate 6000 exposed from the fin portions 621, and the tops of the isolating layers 660 are lower than the tops of the fin portions 621.

What needs to be illustrated is that, after grooves are formed in the base, the flatness of the bottom surfaces of the grooves is relatively high, and when the pseudofin portions 613 are not removed, the top surface of the substrate at the bottoms of the pseudofin portions 613 is a part of the bottom surfaces of the grooves, and therefore, the flatness of the top surface of the substrate at the bottoms of the pseudofin portions 613 is relatively high.

In subsequent steps, the pseudofin portions 613 are removed. Because the material of the pseudofin portions 613 is high in etching selection ratio with the material of the fin portions, after the pseudofin portions 613 are removed, the flatness of the surface of the substrate is relatively high, and the isolating layers covering the substrate 6000 are formed after the pseudofin portions 613 are removed, so as to reduce the occurrence of the situation that the substrate is exposed from the isolating layers 660, and therefore, the problem of leakage of the devices is relieved, improvement of the properties of the devices is facilitated, and then the property uniformity is improved.

Specific descriptions of the forming method of the present form are available in reference to related descriptions of the implementations of the second form, and are not further described herein.

Figure 27:
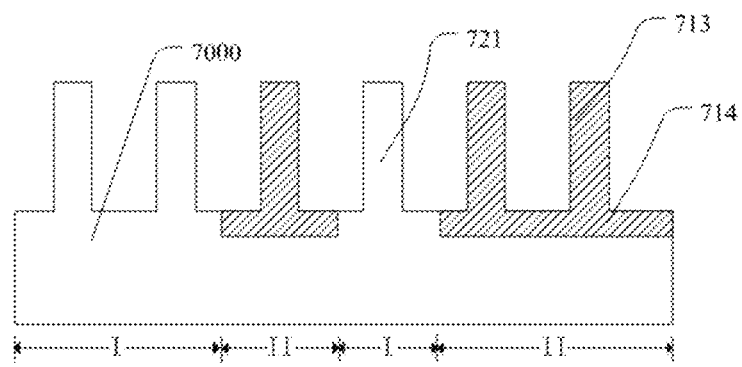
FIG. 27 to FIG. 28 are structure schematic diagrams of one form of a semiconductor structure of the present disclosure.
Figure 28:
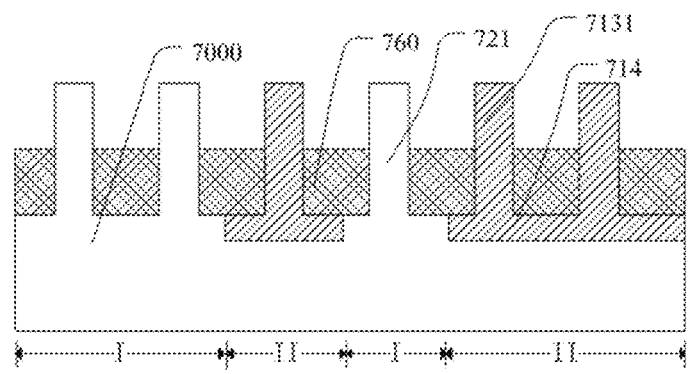

The present disclosure also provides a semiconductor structure. FIG. 27 to FIG. 28 are structure schematic diagrams of a first form of the semiconductor structure of the present disclosure.

Referring to FIG. 27, the semiconductor structure includes a substrate, the substrate 7000 includes device areas I, and isolating areas II located between the device areas I; multiple independent fin portions 721, which are located on the substrate 7000 in the device areas I and are the same as the substrate in material; and multiple independent pseudofin portions 713, which are located on the substrate 7000 of the isolating areas II and are different from the substrate in material.

In some implementations, the semiconductor structure also includes isolating structures 714 located below the pseudofin portions 713, the width of the isolating structures 714 is greater than the width of the pseudofin portions 713, the isolating structures 714 are located between the substrate 7000 and the pseudofin portions 713, the isolating structures 714 and the pseudofin portions 713 are of an integrated structure, and the surface of the substrate in the isolating areas II is lower than the surface of the substrate in the device areas I.

The isolating structures 714 are located between adjacent device areas I, so as to further isolate devices in the adjacent device areas I, and then be beneficial to further improvement of the properties of the devices.

In some implementations, materials of the isolating structures 714 and the pseudofin portions 713 are both an insulating material, and the insulating material is silicon oxide or silicon oxynitride.

In some implementations, the height of the fin portions 721 and the height of the pseudofin portions 713 tend to be the same, the fin portions 721 and the pseudofin portions 713 are formed in the same step, so as to reduce the technical difficulty.

Referring to FIG. 28, what needs to be illustrated is that, the semiconductor structure also includes isolating layers 760, and the isolating layers 760 are located on the substrate 7000 exposed from the fin portions 721 and the pseudofin portions 713, and cover a part of the side walls of the pseudofin portions 713. The material of the isolating layers 760 is silicon oxide, silicon nitride or silicon oxynitride.

According to the semiconductor structure and the forming method thereof of the present disclosure, the substrate 7000 is etched to form multiple independent fin portions 721, the isolating structure 714 are formed at the bottom ends of the pseudofin portions 713, the isolating areas II are located between the device areas I, and therefore, the pseudofin portions 713 play a support role between the fin portions 721. In this way, in the subsequent process of forming the isolating layers 760, because the distance difference between the fin portions 721 or between the fin portions 721 and the pseudofin portions 713 is not great, the problem of non-uniform thickness of the isolating layers 760 is hard to cause, and therefore, the possibility that the fin portions 721 are bent or inclined is relatively low, and then further improvement of the properties and property uniformity of devices is facilitated.

FIG. 14 to FIG. 15 show structure schematic diagrams of a second form of a semiconductor structure of the present disclosure.

Referring to FIG. 14, similarities of the present form and implementations of the first form of the semiconductor structure are not further described herein. The difference between the present form and implementations of the first form is that: the bottom surfaces of the pseudofin portions 213 are in contact with the surface of the substrate 2000.

In some implementations, the material of the pseudofin portions 213 is one insulating material, and the material of the pseudofin portions 213 is silicon oxide or silicon oxynitride.

Referring to FIG. 15, the semiconductor structure also includes the isolating layers 260 formed on the substrate 2000 exposed from the fin portions 221 and the pseudofin portions 213 in the subsequent processes, and the isolating layers 260 cover a part of side walls of the pseudofin portions 213.

In forms of the semiconductor structure and forms of the forming method thereof of the present disclosure, the substrate 2000 is etched to form multiple independent fin portions 221, the bottom surfaces of the fin portions 221 are in contact with the surface of the substrate 2000, the pseudofin portions 213 are located between the fin portions 221, and the pseudofin portions 213 play a support role between the fin portions 221. In this way, in the subsequent process of forming the isolating layers 260, because the distance difference between the fin portions 221 or between the fin portions 221 and the pseudofin portions 213 is not great, the problem of non-uniform thickness of the isolating layers 260 is hard to cause, and therefore, the possibility that the fin portions 221 are bent or inclined is relatively low, and then further improvement of the properties and property uniformity of devices is facilitated.

FIG. 16 to FIG. 17 show structure schematic diagrams of a third form of a semiconductor structure of the present disclosure.

Referring to FIG. 16, similarities between the present form and implementations of the first form of the semiconductor structure are not further described herein. The difference between the present form and implementations of the first form is that: the pseudofin portions 313 include bottom pseudofin portions 3132 and top pseudofin portions 3131 located on the bottom pseudofin portions 3132, and the bottom pseudofin portions 3132 and the substrate 3000 are of an integrated structure.

In some implementations, the material of the top pseudofin portions 3131 is one insulating material, and the material of the pseudofin portions 213 is silicon oxide or silicon oxynitride.

Referring to FIG. 17, the semiconductor structure also includes the isolating layers 360 formed on the substrate 3000 exposed from the fin portions 321 and the pseudofin portions 313 in the subsequent process, the isolating layers 360 cover a part of side walls of the bottom pseudofin portions 3132, and the top ends of the isolating layers 360 are lower than the top ends of the fin portions 321.

In forms of the semiconductor structure and forms of the method for forming a semiconductor structure, multiple independent fin portions 321 are formed on the substrate 3000 of the device areas I, multiple independent pseudofin portions 313 are formed on the substrate 3000 of the isolating areas II, the pseudofin portions 313 include bottom pseudofin portions 3132 and top pseudofin portions 3131 located on the bottom pseudofin portions 3132. Because the isolating areas II are located between the device areas I, the pseudofin portions 313 play a support role between the fin portions 321. In this way, in the subsequent process of forming the isolating layers 360, because the distance difference between the fin portions 321 or between the fin portions 321 and the pseudofin portions 313 is not great, the problem of non-uniform thickness of the isolating layers 360 is hard to cause, and therefore, the possibility that the fin portions 321 are bent or inclined is relatively low, and then further improvement of the properties and property uniformity of devices is facilitated.

FIG. 18 shows a structure schematic diagram of a fourth form of a semiconductor structure of the present disclosure.

Referring to FIG. 18, similarities of the present form and implementations of the third form of the semiconductor structure are not further described herein. The difference between the present form and implementations of the third form is that: the material of the top pseudofin portions 4131 is different semiconductor material than that of the substrate, which reduces the technical difficulty of removing the top pseudofin portions 4131.

Specifically, when the material of the substrate 4000 is silicon, the material of the top pseudofin portions is silicon germanide.

In some implementations, the bottom pseudofin portions 4132 and the substrate 4000 are of an integrated structure. In some implementations, in subsequent steps, after the top pseudofin portions 4131 are removed, because the material of the top pseudofin portions 4131 is different from the material of the bottom pseudofin portions 4132, and the bottom pseudofin portions 4132 and the substrate are of an integrated structure, after the top pseudofin portions 4131 are removed, the height uniformity of the bottom pseudofin portions 4132 is relatively good, the isolating layers 460 covering the substrate are formed after the top pseudofin portions 4131 are removed, and the isolating layers 460 cover the bottom pseudofin portions 4132, so as to reduce the occurrence of the situation that the substrate is exposed from the isolating layers 460, and therefore, the problem of leakage of devices is relieved, improvement of the properties of the devices is facilitated, and then the property uniformity is improved.

FIG. 21 additionally shows a structure schematic diagram of a fifth form of a semiconductor structure of the present disclosure.

Referring to FIG. 21, similarities of the present form and implementations of the first form of the semiconductor structure are not further described herein. The difference between the present form and implementations of the first form is that: the material of the pseudofin portions 513 is a different semiconductor material than that of the substrate.

The semiconductor structure also includes isolating structures 514 located in the substrate 5000 located below the pseudofin portions 513. The materials of the pseudofin portions 513 and the isolating structure 514 are both a semiconductor material with a high etching selection ratio with the substrate 5000, which reduces the technical difficulty of removing the pseudofin portions 513.

Specifically, when the material of the substrate 5000 is silicon, the materials of the pseudofin portions 513 and the isolating structures 514 are both silicon germanide.

In some implementations, in subsequent steps, the pseudofin portions 513 are removed. Because the material of the pseudofin portions 513 is different from the material of the fin portions, after the pseudofin portions 513 are removed, the flatness uniformity of the upper surfaces of the isolating structures 514 is relatively good, and after the pseudofin portions 513 are removed, the isolating layers 560 covering the substrate and the isolating structures 514 are formed, so as to reduce the occurrence of the situation that the substrate is exposed from the isolating layers 560, and therefore, the problem of leakage of devices is relieved, improvement of the properties of the devices is facilitated, and then the property uniformity is improved.

FIG. 24 shows a structure schematic diagram of a sixth form of a semiconductor structure of the present disclosure.

Referring to FIG. 24, similarities between the present form and implementations of the second form of the semiconductor structure are not further described herein. The difference between the present form and the implementations of the second form is that: the material of the pseudofin portions 613 is a different semiconductor material than that of the substrate, which reduces the technical difficulty of removing the top pseudofin portions.

Specifically, when the material of the substrate 6000 is silicon, the material of the pseudofin portions 613 is silicon germanide.

In some implementations, in subsequent steps, the pseudofin portions 613 are removed. Because the etching selection ratio between the material of the pseudofin portions 613 and the material of the fin portions is high, after the pseudofin portions 613 are removed, the flatness of the upper surface of the substrate is relatively high, and after the pseudofin portions 613 are removed, the isolating layers covering the substrate 6000 are formed, so as to reduce the occurrence of the situation that the substrate is exposed from the isolating layers 660, and therefore, the problem of leakage of devices is relieved, improvement of the properties of the devices is facilitated, and then the property uniformity is improved.

The semiconductor structure described in the present form is formed by adopting the forming method described in the foregoing embodiments, and is also formed by adopting other forming methods. In the present form, specific descriptions of the semiconductor structure are available in reference to corresponding descriptions in the foregoing embodiments, and are not further described herein.

Although the present disclosure has been disclosed above, the present disclosure is not limited by the above describe. A person skilled in the art may make various alterations and modifications without departing from the spirit or scope of the present disclosure, and therefore, the protection scope of the present disclosure should be subject to the scope as defined by the claims.

What is claimed is:

1. A forming method of a semiconductor structure, comprising:
   providing a base;
   forming multiple spaced filling layers in the base, wherein the filling layers are semiconductor layers that are different from the base in material, and the pseudofin portions comprise top pseudofin portions formed by the filling layers;
   etching the base, to form multiple independent fin portions, the fin portions comprising a same material as the base;
   etching the filling layers and the base located below the filling layers to form multiple independent pseudofin portions, the pseudofin portions being located between the fin portions, the pseudofin portions comprising bottom pseudofin portions located below the top pseudofin portions and formed by the base and the pseudofin portions comprising different material than the material of the fin portions, wherein a substrate is located at bottoms of the fin portions or the pseudofin portions after the etching; and
   after forming the fin portions and the pseudofin portions, removing the top pseudofin portions;

after removing top pseudofin portions, forming isolating layers on the substrate exposed from the fin portions and covering the bottom pseudofin portions with the isolating layers, wherein tops of the isolating layers are lower than tops of the fin portions.

2. The forming method of the semiconductor structure according to claim 1, wherein the base and the filling layers are etched in the same etching step, so as to form the fin portions and the pseudofin portions.

3. The forming method of the semiconductor structure according to claim 1, wherein the step of forming the fin portions and the pseudofin portions comprises:
forming a mask material layer covering the base and the filling layers;
forming multiple independent core layers on the mask material layer;
forming mask side walls covering the side walls of the core layers;
removing the core layers after the mask side walls are formed;
etching the mask material layer by taking the mask side walls as a mask after the core layers are removed, and taking the residual mask material layer after etching as a mask layer; and
etching the base and the filling layers by taking the mask layer as the mask, to form the fin portions and the pseudofin portions.

4. The forming method of the semiconductor structure according to claim 1, wherein the step of etching the filling layers to form multiple independent pseudofin portions comprises: partially etching the filling layers to form multiple independent pseudofin portions.

5. The forming method of the semiconductor structure according to claim 1, wherein the step of etching the filling layers to form multiple independent pseudofin portions comprises: etching the filling layers until the base below the filling layers is exposed, to form multiple independent pseudofin portions.

6. The forming method of the semiconductor structure according to claim 1, wherein the step of etching the filling layers to form multiple independent pseudofin portions comprises:
etching the filling layers and etching a part of the base below the filling layers, to form multiple independent pseudofin portions.

7. The forming method of the semiconductor structure according to claim 1, wherein the step of forming the filling layers comprises:
forming multiple spaced grooves in the base;
filling the grooves with a filling material layer; and
performing flattening processing on the filling material layer.

8. The forming method of the semiconductor structure according to claim 7, wherein a process of filling the grooves with the filling material layer is mobile chemical vapor deposition.

* * * * *